United States Patent [19]

DeMarco et al.

[11] 4,262,275
[45] Apr. 14, 1981

[54] HALL EFFECT APPARATUS FOR FLUX CONCENTRATOR ASSEMBLY THEREFOR

[75] Inventors: Joseph L. DeMarco, Vestal, N.Y.; Edward W. Kunkler, Sayre, Pa.; Richard J. Wolff, Vestal, N.Y.

[73] Assignee: International Business Machines Corporation, Armonk, N.Y.

[21] Appl. No.: 134,715

[22] Filed: Mar. 27, 1980

[51] Int. Cl.³ .............................................. H01L 43/06
[52] U.S. Cl. .................................... 338/32 H; 323/368
[58] Field of Search .......................... 338/32 H, 32 R; 324/251, 252; 323/44 H; 307/309

[56] References Cited

U.S. PATENT DOCUMENTS

| | | | |
|---|---|---|---|
| 3,373,391 | 3/1968 | Böhm et al. | 338/32 H |
| 3,435,332 | 3/1969 | Kurdyla | 324/251 X |
| 3,825,777 | 7/1974 | Braun | 307/309 |
| 3,845,445 | 10/1974 | Braun | 338/32 H |
| 4,132,970 | 1/1979 | Masuda et al. | 338/32 R |

OTHER PUBLICATIONS

J. P. Bolash et al., IBM Technical Disclosure Bulletin, "Monolithic Hall Cell System", vol. 21, No. 7, pp. 2717-2718, 12/78.

"Technical Data Carpenter High Permeability '49'" Carpenter Technology, Carpenter Steel Division, No. 8-75/2½ M (9-70).

Primary Examiner—C. L. Albritton
Attorney, Agent, or Firm—Norman R. Bardales

[57] ABSTRACT

A Hall effect package structure is provided with a cap which carries integral reference plane establishing members for establishing the gap between the facing ends of two elongated flux concentrator members in which a semiconductor chip having at least one Hall effect region is located. A pair of demountable C-shaped flux concentrator members engage therebetween the remote ends of the elongated flux concentrator members.

10 Claims, 21 Drawing Figures

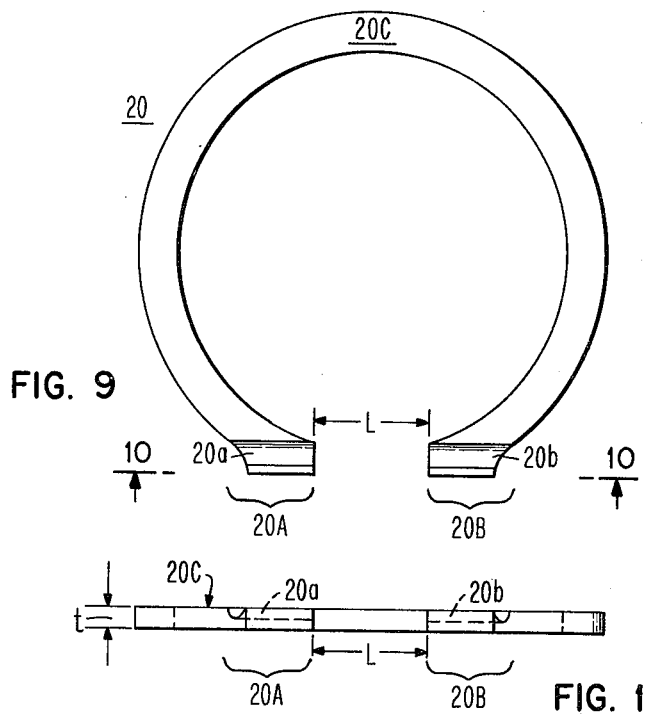
FIG. 9
FIG. 10
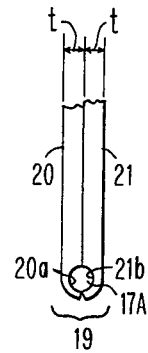
FIG. 11
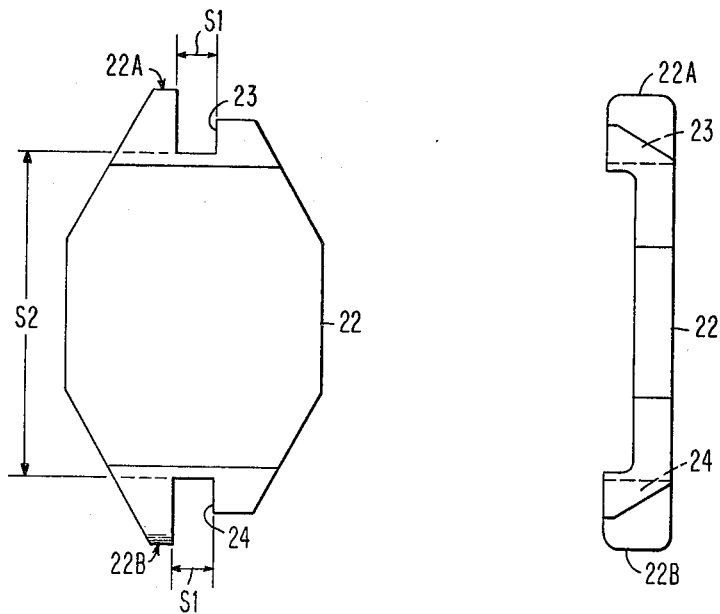
FIG. 12
FIG. 13

HALL EFFECT APPARATUS FOR FLUX CONCENTRATOR ASSEMBLY THEREFOR

BACKGROUND OF THE INVENTION

1. Field of the Invention

This invention relates to Hall effect apparatus and more particularly to flux concentrator assembly means for Hall effect apparatus.

2. Description of the Prior Art

U.S. Pat. No. 3,825,777 entitled "Hall Cell with Offset Voltage Control", R. J. Braun and assigned to the common assignee herein, contains a general description of Hall effect devices. Briefly, as described therein, a Hall effect device generally comprises a body of Hall material. A transverse electric field is created in the body by the passage of current through the body between two spaced electrodes across which is connected an appropriate electrical supply. The two electrodes are referred to synonymously in the art, and as used herein, as the input, main, control and/or current electrodes. A second pair of spaced electrodes are located intermediate of the current electrodes. The second pair of electrodes are referred to synonymously in the art, and as used herein, as the output, sense, sensor, sensing probe, or Hall electrodes. In the semiconductor Hall cell types, the body is in addition a semiconductor material of a given conductivity type and the electrodes are generally co-planar.

In operation, the body is inserted in a magnetic field which is or has a component normal to the plane formed by the intersection of the current passing through the body and the resultant transverse electrical field it produces. Under these conditions, a Hall voltage results between the sense electrodes. This Hall voltage is proportional to the main current and magnetic field strength. The voltage across the sense electrodes will be at a null whenever the magnetic field is absent and/or the main current is absent. Ideally, if the two sense electrodes are apatially located on an equipotential line or points of the electric field, the null voltage will be zero. However, in practice because of factors due to magnetic remanescence, manufacturing tolerances and the like and/or as well as external conditions such as changes in environmental parameters as temperature and the like, the null is generally at some other finite level. The null voltage is referred to as an offset voltage.

In the aforementioned U.S. Pat. No. 3,825,777, the Hall devices described therein are in particular provided with offset voltage controls which include one or more auxiliary electrodes disposed at preselected spatial positions of the Hall device body between its current and sense electrodes. The auxiliary electrode(s) when connected to a predetermined electrical supply provide an auxiliary electrical field that controls the offset voltage at the sense electrodes.

It is also well known to those skilled in the art that the magnetic field sensitivity of a Hall device varies inversely with the magnetic reluctance of the total flux path. U.S. Pat. No. 3,845,445 entitled "Modular Hall Effect Device", R. J. Braun et al and assigned to the common assignee herein, describes an arrangement of two flux concentrators with an effective magnetic air gap therebetween. The gap is only slightly more than the thickness of the Hall device located in the gap and there results an improved sensitivity.

Referring more specifically and in greater detail to the flux concentrator arrangement and Hall device of the aforementioned U.S. Pat. No. 3,845,445, the two concentrators are bascially a soft iron carrier plate and a T-shaped soft iron flux concentrator, respectively, and the Hall device is a semiconductor chip, i.e. planar, type, with the electrodes thereof located on one of its planar surfaces, hereinafter sometimes referred to as its electrode surface.

The two flux concentrators and chip are part of a module, which is of the pluggable type. The module includes a box-like molded plastic housing. The housing has two juxtaposed mating sections, to wit: a rectangular-shaped base section and a compatible rectangular-shaped top section. The last mentioned section has an inner rectangular cavity that is in facing relationship with the topside of the base section in a cover-like manner. In the final assembly, the two sections are joined together by ultrasonic welding or other suitable means.

The top, i.e. upper, section of the housing has a central rectangular opening which extends from the top, i.e. outer, surface of the upper section to the aforementioned inner cavity. The T-shaped flux concentrator is mounted in this opening as an insert with the sidewalls of its compatibly contoured rectangular-shaped horizontal cross arm portion in direct contact with the sidewalls of the hole and such that its vertical leg portion extends freely and fully into the aforementioned cavity. The top surface of the T-shaped flux concentrator is flush with the top surface of the top section.

In the base section, a central rectangular hole extends from the topside of the base section to an elongated groove which runs along the underside of the base section. The groove has a U-shaped channel-like configuration with a rectangular cross-section and extends partially inward from the aforementioned underside. The groove is in colinear alignment with one of the central orthogonal longitudinal axes of the rectangular base section. The central rectangular hole of the base section and the rectangular flux concentrator carrier plate have compatible dimensions so that the plate is mounted as an insert in the hole, their respective adjacent sidewalls being in direct contact with each other. The plate is located at the lower end of the hole with the lower surface of the carrier plate being flush with the surface of the horizontal or base portion of the channel.

As such, the carrier plate has its lower side, i.e. surface, seated on the top surface of a band or strap-like soft iron flux core concentrator, which is mounted as an insert in the groove. The strap-like concentrator has a rectangular cross-section configuration compatible to that of the groove. As a result, the walls of the groove are in direct contact with the adjacent surfaces of the strap-like concentrator, and the latter's bottom surface is flush with the underside of the base section. The Hall effect chip, which is smaller than the carrier, has its non-electrode planar surface in turn bonded directly to the upper side of the carrier plate by an epoxy. The chip is thus located partially in the central hole of the housing's base section and extends upwardly and outwardly into the cavity of the housing's top section with the electrode planar surface of the chip being above the plane of the topside of the base section. Four flying leads, i.e. wire conductors, connect the four electrodes of the Hall chip to the heads of four pluggable terminal pins, respectively, of the module.

The four pins are mounted in the housing base section in a symmetrical manner, two on each side of the groove and are normal to the base section's topside and underside parallel planar surfaces. More specifically, the heads of the pins extend slightly above the top surface of the base section and into the cavity of the top section, and the lower ends of the pins extend outwardly from the underside of the bottom section an appropriate uniform distance so as to effectuate a pluggable module configuration.

The T-shaped concentrator mounted in the top section is in alignment with the chip and carrier plate mounted in the base section, when the two sections are in final assembly. In some cases, the carrier plate may be obviated and in which case the chip is directly bonded to the top of the flux concentrator strap where it is exposed through the central hole in the base section.

The flux concentrator strap for most of the embodiments described in U.S. Pat. No. 3,845,445 is U-shaped with the longitudinal base portion thereof being flush mounted in the groove as aforementioned and each of the two vertical legs thereof being extended upwards from the groove through appropriately aligned holes in the base and top sections of the housing. Each leg and the aligned holes through which it extends are compatibly contoured placing their respective adjacent surfaces in direct contact.

In the housing top section, the two holes provided for each strap leg symmetrically straddle and are in linear alignment with the aforementioned central opening provided for the T-shaped flux concentrator member. The top section's two holes, which are provided for the legs, extend from the topside of the top section and through two opposite sidewalls thereof which form two of the sides of the aforementioned cavity. Each of the top section's two holes extend to the respective aligned corresponding one of the two holes of the base section provided for each strap leg.

The last mentioned two holes of the base section symmetrically straddle and are in linear alignment with the aforementioned central hole of the base section provided for the carrier plate and Hall effect chip. The two strap leg holes of the base section extend from the topside of and down through the base section to the horizontal portion of the aforementioned U-shaped groove formed on the underside of the base section.

In one embodiment, the end faces of the both legs of the flux concentrator strap are flush with the top surface of the top section. In another embodiment, only the end face of one leg is flush with the top surface of the top section, the other leg being further extended above the top surface and formed into a loop which places its end face in contact with the top of the flush mounted T-shaped concentrator, and to which it is then directly connected.

In still another embodiment, the legs of the flux concentrator strap are removed and only the base portion of the strap is mounted in the groove. One leg of an external U-shaped soft iron member is directly connected to the underside of the flush mounted base portion of the flux concentrator strap in the base section and the other leg is directly connected to the top of the flush mounted T-shaped flux concentrator in the top section.

The Hall effect modules or packages of U.S. Pat. No. 3,845,445, while permitting close tolerance positioning of the flux concentrators to the chip Hall area, were not conducive to precision mounting of the flux concentrators in a simple and/or reliable manner. As a result, the air gap, i.e. spacing, between the two flux concentrators in which the chip is located was capable of varying from module to module of the same nominal size and thereby adversely effecting the standardization and/or calibration of the module.

Moreover, the aforedescribed modules of U.S. Pat. No. 3,845,445 were not readily conducive to assembly and/or disassembly. For example, by ultrasonically welding the top and bottom housing sections together, the chip and flying lead connections thereof were not accessible for replacement and/or repair without destruction of one or both of the sections and hence the module per se. Also, because the flux concentrator inserts were flush mounted with the respective surfaces of the housing sections, accessibility for direct connection thereto was limited and/or unreliable, particularly in those cases where an external loop type soft iron member was to be directly connected thereto. Moreover, these loop type members were not readily disconnectable from the flux concentrators. Thus, for example, the attachment or detachment of the loop member around an external wire conductor, in the case of the use of the module as a current sensor, was not facilitated by the aforedescribed modules. Thus, for example, the wire conductor to be sensed had to be severed or disconnected at one end to allow passage of the wire conductor through the loop-like member which is impractical and/or undesirable in many applications.

SUMMARY OF THE INVENTION

It is an object of this invention to provide Hall effect apparatus with an improved flux concentrator assembly.

It is another object of this invention to provide Hall effect apparatus with a flux concentrator assembly that has a highly reliable air gap spacing.

It is still another object of this invention to provide Hall effect apparatus and a flux concentrator assembly combination that is readily adaptable to modular construction and/or readily assembled and/or disassembled.

Still another object of this invention is to provide Hall effect apparatus and a flux concentrator assembly combination of the clamp-on and/or quick disconnect type.

According to one aspect of the invention, a Hall effect apparatus includes a non-magnetic member having first and second opposite sides. A cavity extends partially and inwardly from the second side toward the first side. Reference plane establishing means is carried by the non-magnetic member within the cavity. A substrate, having a plurality of input/output terminal means and a predetermined planar surface, has a Hall effect device mounted on the predetermined planar surface. The Hall effect device has electrodes connected to the terminal means. Flux concentrator assembly means are provided which has at least one flux concentrator member. The flux concentrator member is mounted to the non-magnetic member and extends through the non-magnetic member from its first side and into its cavity a predetermined distance correlated by the reference plane establishing means. The substrate is mounted within the cavity with the planar surface in contacting relationship with the reference plane establishing means to juxtapose the Hall effect device in the cavity adjacent to the flux concentrator member, which is extended in the cavity, at a predetermined spacing therefrom.

The foregoing and other objects, features and advantages of the invention will be apparent from the more particular description of a preferred embodiment of the invention, as illustrated in the accompanying drawing.

BRIEF DESCRIPTION OF THE DRAWING

FIGS. 9 and 10 are side and edge views, respectively, of one of the flux concentrator rings of FIGS. 1-2, FIG. 10 being taken along line 10—10 of FIG. 9;

FIG. 11 is a partial edge view of the two flux concentrator rings of FIGS. 1-2 illustrating their coaction with the flux concentrator member of FIG. 8;

FIGS. 12 and 13 are side and edge views, respectively, of the bias and locking means of FIGS. 1-2;

In the figures, like elements are designated with similar reference numbers.

DESCRIPTION OF THE PREFERRED EMBODIMENT

Figure 1:
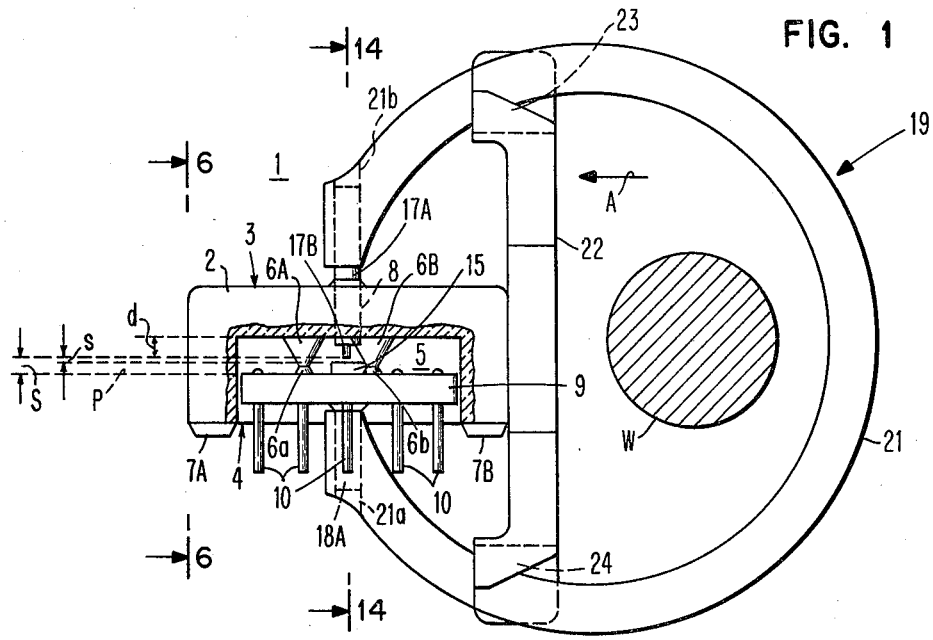
FIG. 1 is a side elevation view, partially broken away and shown in cross-section, of a preferred embodiment of the Hall effect apparatus and flux concentrator assembly combination of the present invention.
Figure 2:
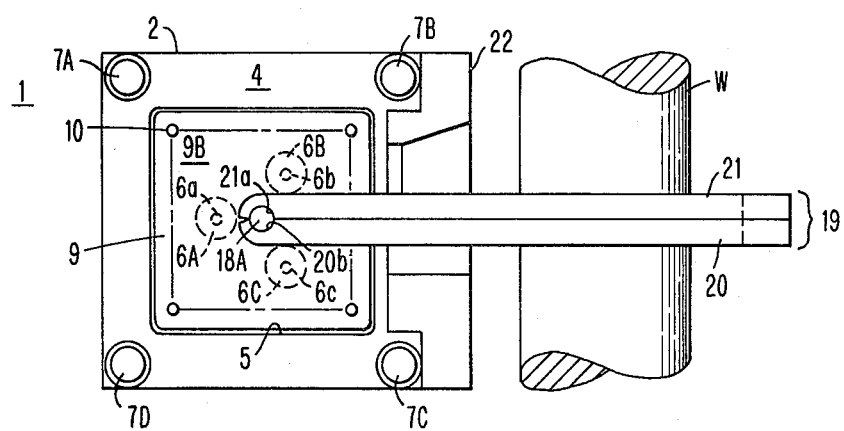
FIG. 2 is a bottom view of the apparatus and assembly of FIG. 1.

Referring to FIGS. 1 and 2, the Hall effect apparatus of the preferred embodiment of the present invention is generally indicated by the reference numeral 1. The non-magnetic housing member 2 thereof has top and bottom opposite sides 3 and 4, respectively, as shown in FIGS. 1, 2, 6, and 7. A cavity 5 extends partially and inwardly from the bottom side 4 and towards top side 3 thus providing the member 2 with a cap or cover-like configuration. Preferably, the member 2 has a rectangular-shape outer configuration, e.g., square, and likewise so has the cavity 5.

Figure 6:
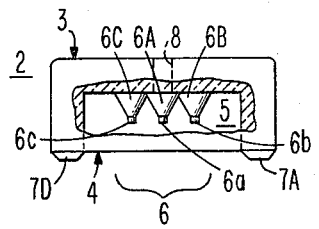
FIG. 6 is a side elevation view, partially broken away and shown in cross-section, of the housing member of FIGS. 1-2; as viewed along the line 6—6 of FIG. 1.
Figure 7:
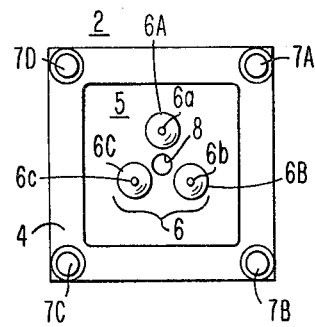
FIG. 7 is a bottom view of the housing member of FIG. 6.

Reference plane establishing means generally indicated by the reference numeral 6 in FIGS. 6-7 are carried by member 2 within cavity 5. Means 6 comprises three inverted truncated cones 6A, 6B, 6C that extend downward from the top inside of cap 2. Each of the cones 6A, 6B, 6C taper down to a concentric cylindrical flat, cf. flats 6a, 6b, 6c which are shown in outline form in FIG. 2 for sake of explanation. Means 6 via its members 6A-6C, 6a-6c, establishes a reference or datum plane P, cf. FIG. 1, used in assembling the apparatus 1 and establishing the air gap spacing S as described hereinafter in greater detail. Cap 2 has four short inverted truncated cones 7A-7D depending from the respective four corners of its bottom side 4 which act as standoffs or pedestals for cap 2. A hole 8 is provided centrally in cap 2 for purposes hereinafter explained. The cones 6A-6C are radially and angularly spaced equally about the center of hole 8. Cap 2 is preferably a molded ceramic such as alumina or the like and the reference plane establishing means 6 is integrally formed therewith.

Mounted in cavity 5 is a substrate 9, cf. FIGS. 1-4, which has a planar surface 9A. Substrate 9 preferably has a rectangular-shaped configuration which fits compatibly within the cavity 5. When substrate 9 is assembled in the cap 2, surface 9A is in a direct contacting relationship with the reference plane establishing means 6 and in particular the flats 6a, 6b, and 6c thereof. Substrate 9 has a plurality of input/output (I/O) terminals. For the preferred embodiment, apparatus 1 is configured as a pluggable module and accordingly the I/O terminals are elongated conductive terminal pins 10 mounted in the body of susbstrate 9 which mate with an appropriate receptacle, not shown, as is apparent to those skilled in the art. The pins 10 pass or extend through the body of substrate 9, their upper ends of heads protruding slightly above the surface 9A. The longer lower ends of pins 10 extend a uniform distance D, cf. FIG. 4, from the bottom planar surface 9B of the substrate 9.

Figure 3:
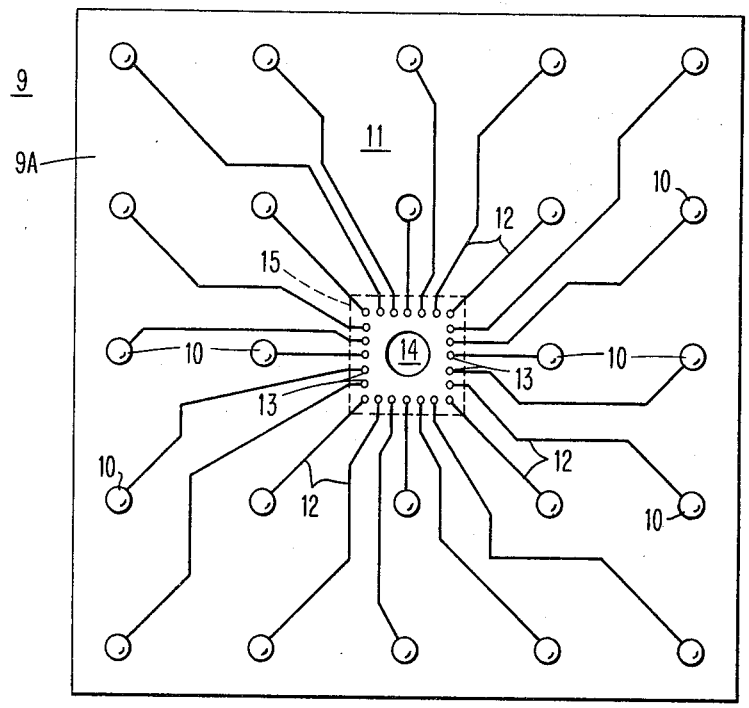
FIGS. 3 and 4 are enlarged schematic top and side views, respectively, of the substrate of FIG. 1.
Figure 4:
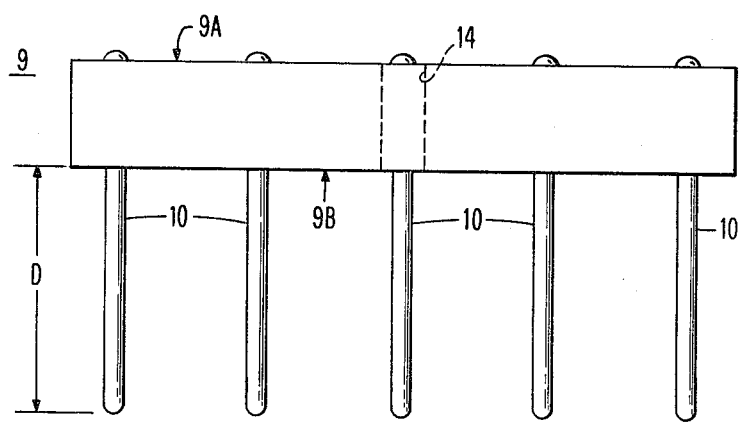

In the preferred embodiment, a conductive circuit pattern, which is generally indicated by the reference numeral 11, cf. FIG. 3, is carried on surface 9A of substrate 9. Pattern 11 includes a plurality of flat conductors which are schematically shown as conductors 12 in FIG. 3. The heads of pins 10 are bonded to the conductors 12. Conductors 12 interconnect the heads of pins 10 to respective bonding pads 13, which are also part of the pattern 11. Centrally located in substrate 9 is a hole 14 for purposes hereinafter explained. The body of substrate 9 is preferably also a molded ceramic of the same material as the cap 2. The substrate 9 is processed using conventional metallization, pinning and tinning i.e. soldering, processes well known to those skilled in the metallized ceramic art.

The Hall effect device of the present invention is preferably embodied in a monolithic system which includes integrated circuitry associated with the operation and/or compensation of the device. Thus, in the preferred embodiment, it should be understood that the planar device 15 is a semiconductor chip, cf. FIG. 1. Chip 15 has upper and lower surfaces 15A, 15B, respectively, cf. FIG. 21. The chip 15 includes one or more Hall cells, i.e. Hall-effect regions or areas, as well as integrated circuitry associated with the cells in a common semiconductor substrate. By way of example, a monolithic system of the aforedescribed kind and suitable for use in the present invention is described in the publication entitled "Monolithic Hall Cell System", J. P. Bolash et al, IBM Technical Disclosure Bulletin, Vol. 21, No. 7, December 1978, pages 2717-2718. Chip 15 carries on its surface 15B a plurality of electrodes, not shown in the drawing for sake of clarity, which include the main and sense electrodes and the auxiliary, if any, electrodes associated with each Hall cell of chip 15, as well as the various electrodes of the support circuits for each Hall cell, i.e., the aforementioned associated integrated circuitry of chip 15.

Chip 15 is mounted on the surface 9A of substrate 9 and has its aforementioned electrodes, not shown, connected to the terminal means, to wit: pins 10, of substrate 9. By way of example, there are twenty-four pins 10 which are arranged in a five-by-five rectangular array in the substrate 9. It should be understood that there is no pin 10 in the center position of the array, the center position being coincident with the hole 14, cf. FIG. 3. The corresponding twenty-four pads 13 are uniformly arranged in a symmetrical rectangular configuration. For the given example, the chip 15 has a corresponding number of pad-like electrodes, not shown, to wit: twenty-four, which are uniformly disposed in a corresponding rectangular configuration on the bottom surface 15B. The bonding pads 13 of substrate 9 and the electrodes, not shown, of chip 15 are in alignment are registration with respect to one another. The electrodes, not shown, of chip 15 are bonded to the pads 13 by a suitable bonding process such as a reflow solder process using reflow solder ball bonds 16, cf. FIG. 21. As a result, the chip 15 is mounted on surface 9A and its electrodes are connected to the pins 10 by the conductors 12 of pattern 11 which fan out from the pads 13 to the respective heads of pins 10.

Figure 8:
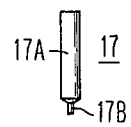
FIG. 8 is a side view of the flux concentrator member associated with the housing member of FIGS. 6-7.

Mounted to cap 2 is a flux concentrator member 17, cf. FIG. 8. Member 17 has an elongated pin-like configuration. Preferably, it has two axially aligned concentric cylindrical integral parts 17A, 17B, cf. FIGS. 1, 8, 14. The longer and larger diameter part 17A fits in a loose or snug-like fit manner in the hole 8 of cap 2. Hole 8 preferably has a circular cross-section of a compatible diameter as that of the part 17A so as to effect the fit. From the top side 3, member 17 extends through the cap 2 and into the cavity 5, cf. in particular tip part 17B, FIG. 1.

The reference plane establishing means 6 carried by the cap 2 establishes the reference plane P, as aforementioned. As such, when the surface 9A of substrate 9 is placed in direct contacting relationship with means 6, the plane P is coincident with the surface 9A. That is to say the surface 9A becomes coplanar, i.e. merges, with plane P. Moreover, when assembling the member 17 in the hole 8 of cap 2, the reference plane establishing means 6 correlates the distance d, cf. FIG. 1, by which the member 17 extends into the cavity 5, as explained hereinafter. Thus, the reference plane means 6 establishes the air gap spacing S defined between the reference plane P and the bottom face of the lower cylindrical part 17B of member 17. Thus, when substrate 9 is mounted in cavity 5 with its surface 9A in contacting relationship with the means 6, the mounted chip 15 is juxtaposed within the cavity 5 adjacent to the flux concentrator member 17 at a predetermined spacing s therefrom, cf. FIG. 1. As is obvious to those skilled in the art, the air gap spacing S is judiciously selected to be only slightly larger than the height H, cf. FIG. 21, of the mounted chip 15 above the surface 9A for the reasons described in the aforementioned U.S. Pat. No. 3,845,445. However, with the reference establishing means 6 of the present invention, the spacing S is established in a simple and/or reliable manner heretofore not possible with the apparatus of the prior art. It should be understood that the Hall effect region, or regions as the case might be, of chip 15 are in substantial alignment with the flux concentrator member 17 and in particular the lower part 17B thereof.

Figure 5:
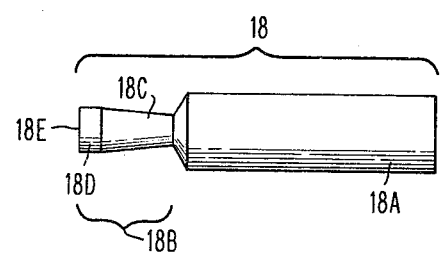
FIG. 5 is a side view of the flux concentrator member associated with the substrate of FIG. 3.

Flux concentrator member 17 is included in a flux concentrator assembly which is associated with apparatus 1. The flux concentrator assembly of the preferred embodiment also includes a second flux concentrator member 18, shown in greater detail in FIG. 5, which is mounted to the substrate 9, cf. FIG. 20. The member 18 has an elongated pin-like configuration. Preferably, member 18 has a long cylindrical part 18A at one end and a tip part 18B at the other end comprising an intermediate truncated cone portion 18C and a short cylindrical portion 18D terminating in a planar or flat surface 18E. Parts 18A and 18B, and hence the latter's constituent portions 18C and 18D, are integral and in axial and concentric alignment. Tip part 18B is adapted to fit in the hole 14 of substrate 9. To effect a loose or snug-like fit, hole 14 preferably has a circular configuration with a diameter compatible to the diameter of portion 18D. In assembling the pin-like member 18 to the substrate 9, the tip 18B is inserted in the hole 14 from side 9B and is positioned so that the surface 18E is at some predetermined location with respect to the surface 9A and, hence, the reference plane P. In the preferred embodiment, this location is coincident with the surface 9A, that is to say the surface 18E is flush mounted with the surface 9A. Thus, the air gap spacing S in the cavity 5 is between members 17 and 18, and in particular between the planar surface of the tip part 17B and the planar surface 18E of tip part 18B. When assembled, the longitudinal central axes of the members 17 and 18 are in substantial linear alignment and are substantially normal to the plane P. The Hall region or regions of device 15 are in substantial alignment with the tip 17B as aforementioned and, hence, with the tip 18B as well.

The flux concentrator assembly also has a demountable flux concentrator member, generally indicated by the reference number 19, cf. FIGS. 1, 2. The member 19 has a loop-like configuration which is readily connectable and/or disconnectable to the apparatus 1 and in particular to the flux members 17 and 18. The member 19 comprises a pair of substantially identical and interchangeable circular or ring-like, and preferably is toroidal or C-shaped, separate sub-members 20 and 21. For sake of clarity, only member 20 is shown in greater detail in FIGS. 9-10, it being understood that member 21 is identically configured. Accordingly, as shown in FIGS. 9-10, member 20 has a generally C-shaped flat configuration of thickness t with a spacing L between its aligned ends 20A, 20B. Ends 20A, 20B are recessed inwardly from the planar surface 20C with aligned elongated grooves 20a and 20b, respectively. In the preferred embodiment, the grooves 20a and 20b have a semicylindrical contour. It should be understood that member 21 has identical constituent elements 21A, 21B, 21C, 21a, 21b corresponding to the elements 20A, 20B, 20C, 20a, 20b, respectively, of member 20.

The members 17 and 18 are more particularly the respective parts 17A and 18A have portions or extensions which extend outwardly from the top side 3 of cap 2 and lower surface 9B of substrate 9, respectively. In the preferred embodiment, the respective radii of the part 17A, portion 18A, and grooves 20a, 20b, 21a, 21b are judiciously selected to be substantially equal. Thus, the two members 20, 21 are assembled to the outwardly extended portions of the parts 17A and 18A in a mirror-image type alignment with their respective surfaces 20C, 21C in facing relationship with each other. As such, the grooves 20a and 21b of members 20 and 21, respectively, are in register and encircle and engage the outwardly extended portion of the parts 17A, cf. FIG. 11. Correspondingly, the grooves 20b and 21a of members 20 and 21, respectively, are in register and encircle and engage the outwardly extended portion of the part 18A, cf. FIG. 2.

The flux concentrator assembly components 17–19 are preferably made from a high magnetic permeability nickel alloy. One such alloy suitable for this purpose is the Carpenter ® High Nickel Alloy designated Carpenter High Permeability "49" and described in a publication entitled, "Technical Data Carpenter High Permeability "49", No. 8-75/2 ½ M (9-70), Carpenter Technology, Carpenter Steel Division. Components 17 and 18 can be machined using conventional lathe processes. Components 20, 21 of member 19 can be machined from roll stock fed through a progressive die which coins the grooves 20a, 20b, 21a, 21b to match the cylindrical surfaces of the pin parts 17A, 18A. After machining, the components 17–20 are annealed to restore the high permeability properties of the alloy as explained in the last-mentioned publication.

A biasing member 22 made of non-magnetic material such as, for example, a glass-filled phenolic or the like maintains the members 20, 21 in locked and assembled position to the parts 17A and 18A. As shown in greater detail in FIGS. 12 and 13, the member 22 has two aligned identical cutouts 23, 24 on two of its opposite sides 22A and 22B, respectively. The cutouts 23, 24 have rectangular cross-sections. The spacing S1, cf. FIG. 12, between the sidewalls of each of the cutouts 23, 24 is compatible to the thickness of both members 20, 21, i.e. S1=2t where t=thickness of each of the members 20, 21. The spacing S2, cf. FIG. 12, between the cutouts 23, 24 is less than the inner diameter of the circular-like members 20, 21. As a result, when the two aligned rings 20, 21 are positioned in the cutouts 23, 24 and the member 22 urged toward the direction of the cap 2, cf. arrow A in FIG. 1, the members 20, 21 are held in tight mechanical and magnetic coupling relationship with respect to each other and to the members 17A and 18A which are seated in their respective grooves 20a, 20b, 21a, 21b. Furthermore, by judiciously selecting the appropriate parameters, the member 22 can be positioned against an exterior vertical sidewall of the cap 2, thereby preventing the pivoting of the ring members 20, 21 about the coaxially aligned members 17A and 18A, if desired. To disassemble the members 20, 21 from the members 17A and 18A, the member 22 is positioned away from the cap 2, i.e. opposite to the direction of arrow A. As such, the apparatus 1 can be readily connected and disconnected to a wire conductor W, such as, for example, in current sensor applications and the like without the necessity of disconnecting the wire conductor W from its installation.

Figure 14:
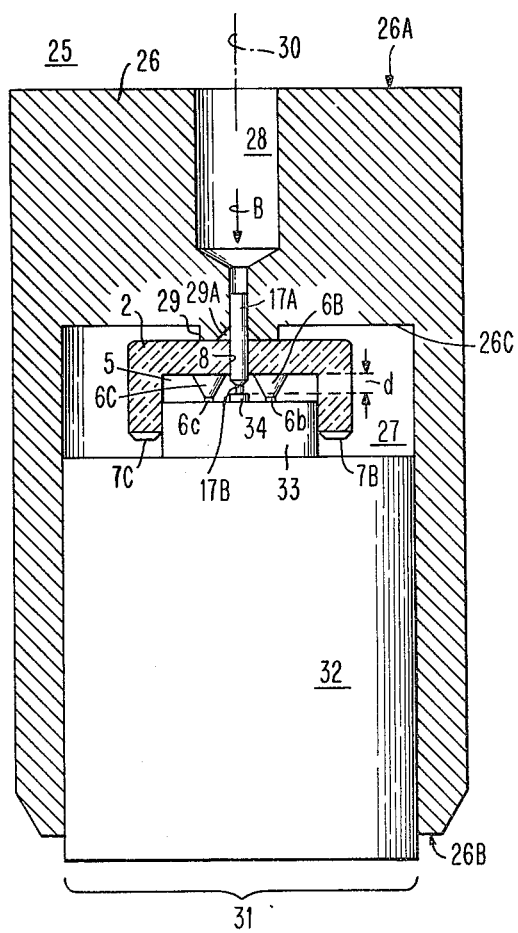
FIG. 14 is a side elevation view, partially shown in cross-section, of a tool assembly used for the insertion of the member of FIG. 8 into the housing member, as viewed along line 14—14 of FIG. 1.

The insertion of the flux concentrator members 17 and 18 in the respective holes 8 and 14 of cap 2 and substrate 9, respectively, may be accomplished by appropriate fixturing tools. By way of example, there is shown in FIG. 14 a precision machined fixturing tool assembly, generally indicated by the reference numeral 25, which is used for inserting number 17 into hole 8. It includes a top outer section 26 which has an outer cylindrical configuration. A cylindrically-shaped recess 27 is inwardly formed from surface 26B in section 26. Also formed in section 26 is a funnel-shaped recess 28, the mouth of which is at surface 26A. The smaller neck or stem of the funnel-shaped recess 28 terminates at the relief 29A formed in extension 29, thereby providing access to the lower recess 27 from surface 26A. Extension 29 surrounds the inverted truncated cone relief 29A and has a cylindrical ring-like outer configuration that extends into recess 27 from surface 26C. The recesses 27, 28 and extension 29 and its relief 29A are concentric about the central longitudinal axis 30 of tool assembly 25.

Figure 16:
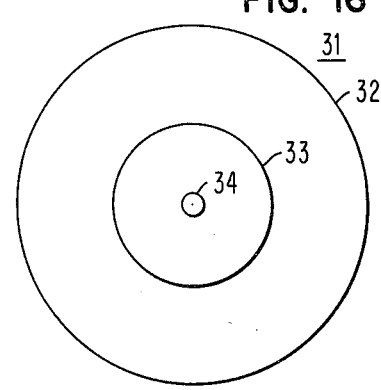
FIGS. 15 and 16 are side and top views, respectively, of the base section of the tool assembly of FIG. 14.
Figure 15:
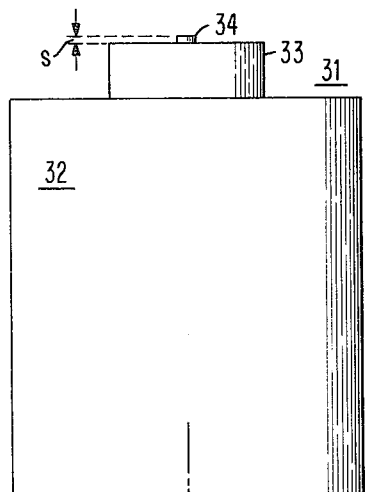

The inner base section 31 of FIGS. 14–16, of tool assembly 25 includes three cylindrically-shaped and integral parts 32–34 which are concentric about axis 30. The lower part 32 is slideably engageable with the sidewall of recess 27 of section 26. Also, the intermediate part 33 is slideably engageable in a tangental manner with the sidewalls of cavity 5 of cap 2. Part 34 acts as a stop and its height is judiciously selected for the desired aforementioned spacing S.

In operation, the pin 17A is inserted into the hole 8 of cap 2. The cavity 5 of cap 2 is then fitted onto the intermediate part 33 and the flats 6a, 6b, 6c placed in contacting relationship with the planar, i.e. flat surface of part 33. With the cap 2 so placed, section 31 is inserted in recess 27 of upper section 26 under a controlled force and the surface 3 is placed in contact with the extension 29 thus insuring a proper seating of cap 2 on section 31. The flux concentrator member 17 is guided by relief 29A upwards into the neck portion of the funnel-shaped recess 28. Part 17A is slideably engageable with the sidewall of the neck portion of funnel-shaped recess 28. An appropriate pusher mechanism weighted rod, not shown, is inserted downwardly, cf. arrow B, into the mouth of the funnel-shaped recess 28 and is placed in contact with the top of member 17A. As a result, the member 17 becomes seated atop the part 34 and hence is at the desired spacing S with respect to the reference plane P defined by cones 6A, 6B, 6C. The clearance between hole 8 and part 17A is sufficient to allow the member 17 to be positioned normal to plane P when it comes to rest on the flat surface of part 34.

In addition to relying on the fit between part 17A and the sidewall of hole 8 to maintain the member 17 at the desired spacing S, it may be affixed thereto by a suitable epoxy. For example, prior to insertion, the part 17A may be coated with an uncured adhesive epoxy, and after the aforedescribed insertion procedure, the assembled member 17 and cover 2, with the aid of the fixture tool assembly 25 and aforementioned weighted rod, not shown, is placed in an oven to cure the adhesive epoxy and effect the bond between part 17A and the sidewall of hole 8.

Figure 17:
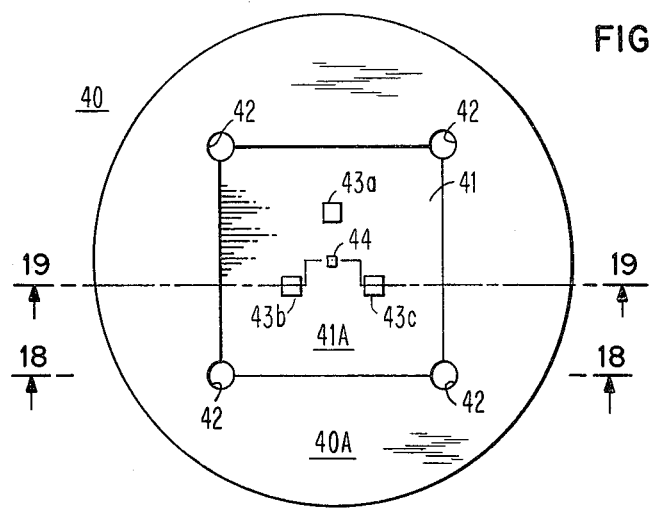
FIG. 17 is a top view of a base section of another tool assembly used with the insertion of the member of FIG. 5 into the substrate.
Figure 18:
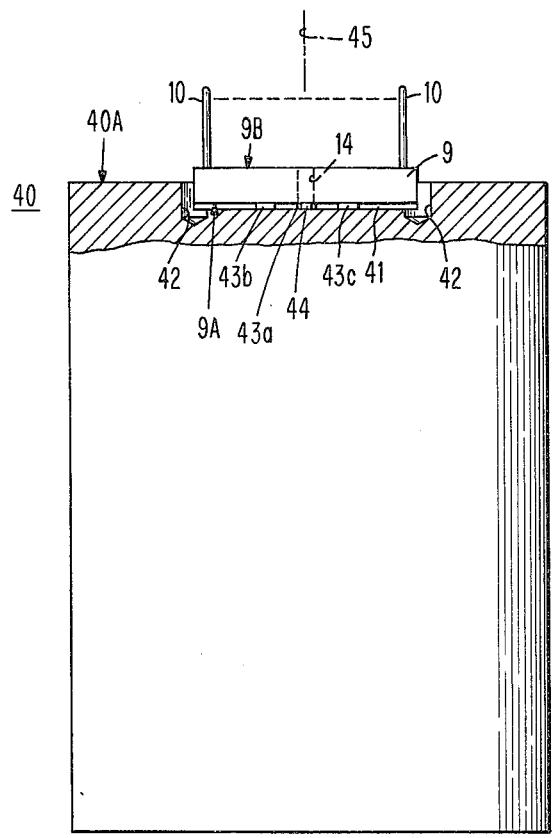
FIG. 18 is a partial cross-sectional view of the tool assembly base section of FIG. 17 taken along the line 18—18 thereof.
Figure 19:
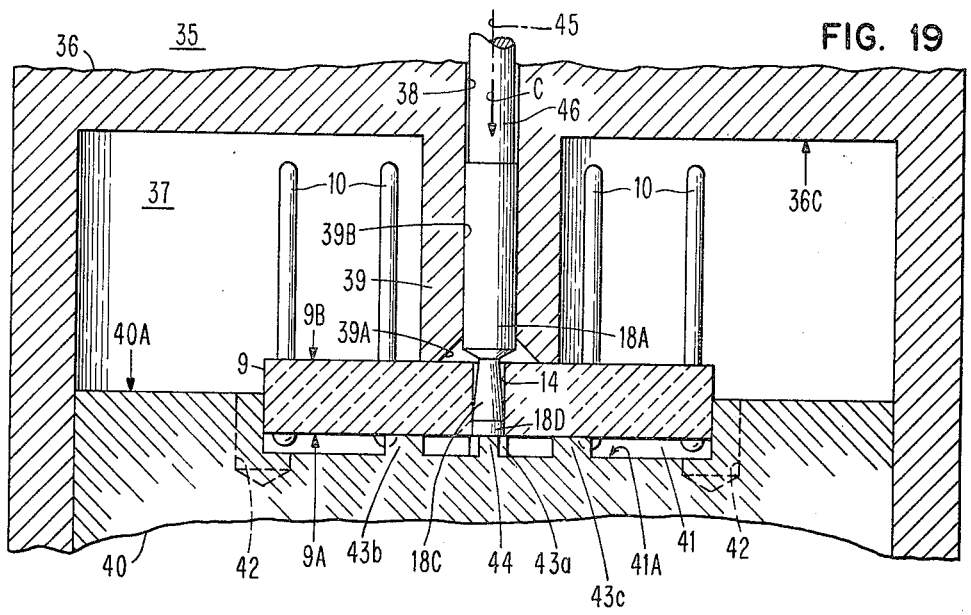
FIG. 19 is an enlarged partial cross-sectional view illustrating the coaction of the top section and of the base section illustrated in FIGS. 17-18, as taken along the line 19—19 of FIG. 17, of the aforementioned another tool assembly used with the insertion of the flux concentrator member of FIG. 5 into the substrate.

Referring now to FIGS. 17–19, a similar precision machined fixturing tool assembly may be used for inserting the member 18 in the hole 14 of substrate 9. For example, there is shown in FIG. 19 a tool assembly 35 that is used for this purpose; FIG. 19 being illustrated in partial form for sake of brevity and clarity. Tool assembly 35 includes a cylindrical outer top section 36 having a cylindrical recess 37, a partially shown funnel-shaped recess 38, and a ring-like extension 39 and its truncated cone relief 39A which corresponds to the top section 26, FIG. 14, and its recesses 27 and 28 and extension 29 and its relief 29A, respectively. Extension 39 is modified to have sufficient height to permit clearance between pins 10 and the inner surface 36C of recess 37. In addition, extension 39 has an upper inner bore or hole 39B of the same diameter as, and which communicates with, the neck of recess 38 to help guide the member 18. It also has, as aforementioned, a relief 39A which guides the member 18. The outside diameter of extension 39 is judiciously selected so that there is sufficient clearance for it to fit between the hole 14 and the pins 10 closest to the hole 14.

Tool assembly 35 has a cylindrically-shaped inner base section 40 which is slideably engageable with the sidewall of recess 37 in a manner similar to the coaction of the sidewall of recess 27 of top section 26 and the part 32 of base section 31 of tool assembly 25, FIG. 14. As shown in greater detail in FIGS. 17–18, the upper planar surface 40A of section has a concentric recess 41 which corresponds to the outline of substrate 9. In the preferred embodiment, recess 41 is accordngly square shaped. The four sidewalls of substrate 9 are slideably engageable with the respective sidewalls of recess 41. Four clearance recesses 42 are also provided at the respective corners of recess 41 to protect the corners of the substrate 9.

Integrally formed on the planar surface 41A of recess 41 are three equally spaced identical extensions 43a–43c which establish a reference plane with respect to the surface 9A of substrate 9 and the member 18 being inserted in the hole 14. Centrally located in extensions 43a–43c is an integrally formed extension 44 which acts as a stop for the tip 18B of member 18. The cross-sectional dimensions of extension 44 are smaller than the diameter of the hole 14 to provide sufficient clearance with the sidewall thereof and thus preserve the integrity of the reference plane establishing extensions 43a–43c. The height of the exension 44 is judiciously selected to provide the desired spacing between the surface 18E, FIG. 5, of member 18 and the surface 9A of substrate 9. In the preferred embodiment, the extension 44 is selected to have the same height as the extensions 43a–43c to provide the aforedescribed flush mounting relationship of the surfaces 18E and 19A. Sections 36, 40 and their respective recesses 37, 38, and 41, and extension 39 are concentric about the central longitudinal axis 45 of the tool assembly 35. The center of extension 44 is coincident with axis 45, the extensions 43a–43c being radially and angularly spaced equally about axis 45.

In operation, the pin 18 is inserted into the hole 14 of substrate 9 so that the part 18A is located on the side of surface 9B. The substrate 9 with its surface 9A facing the recess 41 of section 40 is then fitted into the recess 41, coming to rest atop the extensions 43a–43c. Next, with the pins 10 facing the recess 37, the base section 40 is inserted into the recess 37 of section 36 under a controlled force. The surface 9B of substrate comes into contact with the extension 39 thereby insuring a proper seating of the substrate 9 on the extensions 43a–43c and within the recess 41. Part 18A of member 18, as such, is facing the relief 39A and, is guided upwardly by relief 39A into the hole 39B. Part 18A is slideably engageable with the sidewall of the hole 39B.

The insertion of member 18 can likewise be done with the aid of a pusher mechanism weighted rod 46, cf. arrow C, FIG. 19. As a result, surface 18E is flush mounted with the substrate surface 9A. Moreover, the clearance between hole 14 and part 18B is sufficient to allow the member 18 to be positioned normal to the surface 9A when member 18 comes to rest on the stop extension 44. Also, if desired, an adhesive epoxy bond may be effected between part 18C and the sidewall of hole 14 in a similar manner and for the same reasons as those aforedescribed in regards to part 17A and the sidewall of hole 8.

Figure 20:
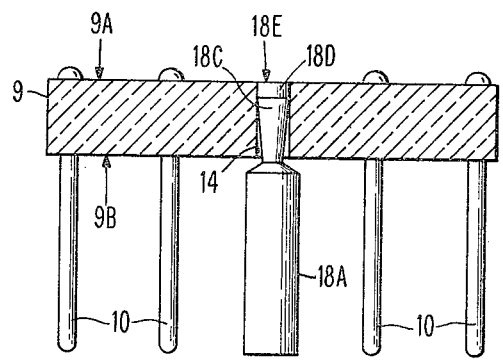
FIG. 20 is a cross-sectional view of the substrate after the member of FIG. 5 is inserted and mounted therein.

As shown in FIG. 20, the member 18 is now mounted in the hole 14 of substrate 9 with the preferred aforementioned flush mounting relationship. Next, the chip 15 is mounted to the bonding pads 13, cf. FIG. 3, on surface 9A of substrate 9 with the solder ball bonds 16 as aforedescribed resulting in the assembly of FIG. 21. For sake of clarity, the chip 15 is shown in outline form in FIG. 3.

It should be understood that the pins 10 are positioned and the conductive pattern 11 is laid out so that the flats 6a–6c avoid direct contact with the heads of pins 10 and the conductors 12 and rest directly on the bare surface 9A of the substrate 9, the three cones 6A–6C being radially and angularly spaced equally about the center of hole 14. Likewise, the extensions 43a–43c of the tool section 40 are positioned so that they rest directly on the surface 9A of the substrate 9 and not on any of the circuitry 11 or heads of the pins 10.

Figure 21:
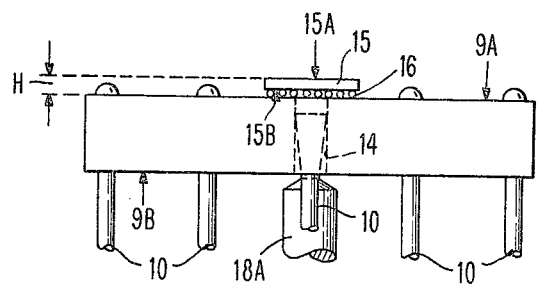
FIG. 21 is a side elevation view of the substrate and flux concentrator member of FIG. 20 after the Hall device is mounted thereto.

Thus, when the assembly of the cap 2 and member 17 is aligned with the assembly of FIG. 21 and are then assembled together, reference plane P associated with the three truncated cones 6A–6C is merged with the reference plane which is coincident with the surface 9A of substrate 9. Consequently, each apparatus 1 is provided with a highly reliable and accurate air gap spacing S which is independent of tolerance mismatches of member 2 and substrate 9. If desired, the last mentioned two assemblies may be hermtically sealed and/or bonded together by, for example, by a permanent or non-permanent adhesive epoxy as is apparent to those skilled in the art.

From the foregoing, it is also readily seen that the apparatus 1 and/or its flux concentrator assembly 17–22 is readily adaptable to modular construction and/or is readily assembled or disassembled. Moreover, the flux concentrator assembly 17–22 allows the apparatus 1 to clamp-on and/or quick-disconnect from a wire conductor W by virtue of the coaction of the assemblies 20, 21 with the member 22 and the parts 17A, 18A of the respective members 17 and 18.

While the invention has been particularly shown and described with reference to a preferred embodiment thereof, it will be understood by those skilled in the art that various changes in form and details may be made therein without departing from the spirit and scope of the invention.

We claim:

1. Hall effect apparatus comprising:
 a non-magnetic member having first and second opposite sides,
 a cavity extending partially and inwardly from said second side toward said first side,
 reference plane establishing means carried by said non-magnetic member within said cavity,
 a substrate having a plurality of input/output terminal means and a predetermined planar surface,
 a Hall effect device mounted on said predetermined planar surface and having electrodes connected to said terminal means, and flux concentrator assembly means having at least one flux concentrator member, said flux concentrator member being mounted to said non-magnetic member and extending through said non-magnetic member from said first side and into said cavity a predetermined distance correlated by said reference plane establishing means, said substrate being mounted within said cavity with said planar surface in contacting relationship with said reference plane establishing means to juxtapose said Hall effect device in said cavity adjacent to said flux concentrator member extended in said cavity at a predetermined spacing therefrom.

2. Hall effect apparatus according to claim 1 wherein:
said substrate has a second planar surface opposite said predetermined planar surface,
said flux concentrator assembly means further having a second flux concentrator member mounted to said substrate and extending through said substrate from said second planar surface toward said predetermined planar surface, and
said Hall effect device is further juxtaposed between said predetermined flux concentrator member and said second flux concentrator member.

3. Hall effect apparatus according to claim 2 wherein:
said predetermined flux concentrator member further has a first extension extending outwardly from said first side of said non-magnetic member,
said second flux concentrator member further has a second extension extending outwardly from said second planar surface of said substrate,
said flux concentrator assembly means further having a pair of loop-like third and fourth flux concentrator members with substantially identical configurations in coacting registration relationship with each other, and being detachably mounted to said first and second extensions.

4. Hall effect apparatus according to claim 3 wherein each of said third and fourth members further have respective first and second ends defining an opening therebetween, said first extension of said predetermined flux concentrator member being engageable between and by said first ends of said third and fourth members, and said second extension of said second flux concentrator member being engageable between and by second ends of said third and fourth members.

5. Hall effect apparatus according to claim 4 further further comprising a removable non-magnetic biasing member for biasing said third and fourth members toward each other to maintain said first and second ends in engagement with the respective first and second extensions therebetween.

6. Hall effect apparatus comprising:
a non-magnetic rectangular member having first and second opposite sides,
a rectangular cavity extending partially and inwardly from said second side toward said first side,
a first hole extending from said first side and into said cavity,
three reference plane establishing members carried by said non-magnetic member within said cavity, said three reference plane establishing members being radially and angularly spaced equally about said first hole,
a substrate having a plurality of input/output terminal means and predetermined planar first and second opposite surfaces,
a second hole extended between said first and second surfaces,
a planar Hall effect device having integrated circuits and at least one Hall cell region, said device being mounted on said predetermined planar first surface, said device having a plurality of electrodes,
connector means for connecting said electrodes to said terminal means, and
flux concentrator assembly means having a first flux concentrator member, said first flux concentrator member being mounted in said first hole to said non-magnetic member and extending therethrough from said first side and into said cavity a predetermined distance correlated by said reference plane establishing members, said flux concentrator assembly means further having a second flux concentrator member mounted in said second hole to said substrate and extending through said second hole from said planar second surface toward said planar first surface,
said substrate being mounted within said cavity with said planar first surface in contacting relationship with said reference plane establishing members to juxtapose said Hall effect device in said cavity between said first and second flux concentrator members with a predetermined spacing between said first flux concentrator member and said Hall effect device.

7. Hall effect apparatus according to claim 6 wherein:
said first flux concentrator member further has a first extension extending outwardly from said first side of said non-magnetic member,
said second flux concentrator member further has a second extension extending outwardly from said second planar surface of said substrate,
said flux concentrator assembly means further having a loop-like third and fourth flux concentrator members with substantially identical configurations in coacting registration relationship with each other, and being detachably mounted to said first and second extensions.

8. Hall effect apparatus according to claim 7 wherein each of said third and fourth members further have respective first and second ends defining an opening therebetween, said first extension of said first flux concentrator member being engageable between and by said first ends of said third and fourth members, and said second extension of said second flux concentrator member being engageable between and by said second ends of said third and fourth members.

9. Hall effect apparatus according to claim 8 further comprising a removable non-magnetic biasing member for biasing said third and fourth members toward each other to maintain said first and second ends in engagement with the respective first and second extensions therebetween.

10. Hall effect apparatus comprising:
a rectangular ceramic member having first and second opposite sides,
a rectangular cavity extending partially and inwardly from said second side toward said first side,
a first hole extending from said first side through said ceramic member into said cavity,
three reference plane establishing members integrally formed on same rectangular ceramic member within said cavity, said three reference plane establishing members being radially and angularly spaced equally about said first hole, a ceramic substrate having a plurality of input/output elongated terminal pins extended between predetermined planar first and second opposite surfaces of said substrate, a second hole extended between said first and second surfaces, a planar Hall effect semiconductor device having integrated circuits and at least one Hall region, said device being mounted on said predetermined planar first surface and over said second hole, said device having a plurality of electrodes, predetermined conductor means carried on said first surface for interconnecting said electrodes to said terminal pins, and a flux concentrator assembly having:

an elongated flux concentrator member mounted within said first hole to said ceramic member and extending therethrough into said cavity a predetermined distance correlated by said reference plane establishing members, said first flux concentrator member further having a first extension extending outwardly from said first side of said ceramic member, an elongated second flux concentrator member mounted within said second hole to said ceramic substrate and extending through said second hole from said planar second surface toward said planar first surface, said second flux concentrator member having a second extension extending outwardly from said planar second surface, a pair of loop-like identical third and fourth C-shaped flux concentrator members, each of said third and fourth C-shaped members having first and second ends defining an opening therebetween, said first extension of said first flux concentrator member being engageable between and by said first ends of third and fourth flux concentrator members, and said second extension of said second flux concentrator being engageable between and by said second ends of said third and fourth flux concentrator members, and a non-magnetic biasing member for biasing said third and fourth flux concentrator members towards each other to maintain said first and second ends in engagement with the respective first and second extensions therebetween, said substrate being mounted within said cavity with said planar first surface in contacting relationship with said reference plane establishing members to juxtapose said Hall effect device in said cavity adjacent to said first flux concentrator member at a predetermined spacing therefrom.

* * * * *